United States Patent
Kong et al.

(10) Patent No.: US 8,359,424 B2
(45) Date of Patent: Jan. 22, 2013

(54) FLASH MEMORY DEVICE AND READING METHOD THEREOF

(75) Inventors: Jae-phil Kong, Hwaseong-si (KR); Chi-weon Yoon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 681 days.

(21) Appl. No.: 12/591,198

(22) Filed: Nov. 12, 2009

(65) Prior Publication Data

US 2010/0125699 A1    May 20, 2010

(30) Foreign Application Priority Data

Nov. 20, 2008 (KR) .................. 10-2008-0115802

(51) Int. Cl.
*G06F 12/00* (2006.01)
(52) U.S. Cl. .... 711/103; 711/156; 711/202; 365/185.33
(58) Field of Classification Search ................ 711/103, 711/156, 202; 365/185.33
See application file for complete search history.

(56) References Cited

U.S. PATENT DOCUMENTS

| | | | |
|---|---|---|---|
| 7,447,067 B2* | 11/2008 | Kong et al. | 365/185.03 |
| 7,451,264 B2* | 11/2008 | Yero | 711/103 |
| 7,463,514 B1* | 12/2008 | Haque | 365/185.03 |
| 7,467,253 B2* | 12/2008 | Yero | 711/103 |
| 7,631,138 B2* | 12/2009 | Gonzalez et al. | 711/103 |
| 7,643,340 B2* | 1/2010 | Kong et al. | 365/185.03 |
| 2007/0035994 A1* | 2/2007 | Kong et al. | 365/185.03 |
| 2008/0068885 A1* | 3/2008 | Kong et al. | 365/185.03 |
| 2008/0256352 A1* | 10/2008 | Chow et al. | 713/2 |
| 2009/0055579 A1* | 2/2009 | Park et al. | 711/103 |

FOREIGN PATENT DOCUMENTS

| | | |
|---|---|---|
| JP | 2001-210082 | 8/2001 |
| JP | 2006-331564 | 12/2006 |
| KR | 10-1999-0013057 | 2/1999 |

\* cited by examiner

*Primary Examiner* — Stephen Elmore
(74) *Attorney, Agent, or Firm* — Harness, Dickey & Pierce, P.L.C.

(57) ABSTRACT

Provided are a flash memory device and a reading method of the flash memory device. A multi-level cell flash memory device includes: a memory cell array comprising main memory cells storing main data, and indicator cells storing indicate data indicating one of a first mode and a second mode in which the main data of the main memory cell, to which the indicate cells correspond, is written; and an output unit outputting in response to a control signal corresponding to the indicate data, one of main data read from the memory cell array and forced data forcing some bit values of the main data to bit values of mode specific data, as reading data.

12 Claims, 5 Drawing Sheets

FLASH MEMORY DEVICE AND READING METHOD THEREOF

FOREIGN PRIORITY STATEMENT

This application claims priority under 35 U.S.C. §119 to Korean Patent Application No. 10-2008-0115802, filed on Nov. 20, 2008, in the Korean Intellectual Property Office (KIPO), the entire contents of which are incorporated herein by reference.

BACKGROUND

Example embodiments relate to a semiconductor memory device, and more particularly, to a flash memory device capable of stably and quickly reading data of important reliability in a multi-level cell flash memory device capable of stably and quickly reading data of important reliability, and a reading method of the flash memory device.

A flash memory device may be classified into a single-level cell (SLC) flash memory cell storing 1-bit data to one memory cell and a multi-level cell (MLC) flash memory cell storing 2 or more bits of data to one memory cell. The MLC flash memory may have the advantage of increasing its data storage capacity, but also, in terms of data reliability, various methods are being discussed to provide data reliability.

SUMMARY

Example embodiments provide a flash memory device which may be capable of stably and quickly reading data of important reliability in a multi-level cell flash memory device, and a reading method of the flash memory device.

According to an aspect of example embodiments, there is provided a multi-level cell flash memory device which may comprise: a memory cell array including main memory cells storing main data, and indicator cells storing indicate data indicating one of a first mode and a second mode in which the main data of the main memory cell, to which the indicate cells correspond, is written; and an output unit outputting one of main data read from the memory cell array and forced data forcing some bit values of the main data to bit values of mode specific data, in response to a control signal corresponding to the indicate data, as reading data.

The first mode may be a multi-level cell (MLC) mode in which main data that is stored in a main memory cell has a plurality of effective data bits, and the second mode may be a single-level cell (SLC) mode in which main data stored in a main memory cell has one effective data bit and at least one dummy data bit.

In the second mode, the effective data bit may be stored in a most significant bit (MSB) of the main data, and the dummy data bit may be stored in a least significant bit (LSB) of the main data.

The data output unit may comprise: a mode detector receiving the indicate data and generating a control signal corresponding to the indicate data; a data generator generating the mode specific data when the control signal is received in a first logic level; a data forcer forcing the mode specific data so that some bits of the main data generate the forced data; and a data output selection unit outputting one of the main data and the forced data in response to the control signal.

When the second mode is a mode in which the main data is one effective data bit and at least one dummy data bit, the mode specific data may have a data value identical to the dummy data bit. Also, when the dummy data bit is stored in a least significant bit (LSB) of the main data, the data forcer may force the mode specific data to the LSB of the main data to generate the forced data.

The multi-level cell flash memory device may further comprise: a main sensing unit performing n sensing operations to read the main data, wherein n is a natural number that is equal to or greater than 2; and an indicate sensing unit sensing the indicate data when the main sensing unit performed an i-th sensing operation, wherein i is a natural number equal to or smaller than n.

When the multi-level cell flash memory device is a 2-bit multi-level cell NOR flash memory device and the main sensing unit performs three sensing operations in order to read the main data, the indicate sensing unit may sense the indicate data when the main sensing unit performs a second sensing operation with respect to the main data.

According to another aspect of example embodiments, there is provided a method of reading data in the above-described multi-level cell flash memory device which may comprise: performing n sensing operations with respect to the main data, wherein n is a natural number equal to or greater than 2; detecting one of the first mode and the second mode based on the indicate data when performing an i-th sensing operation, wherein i is a natural number equal to or smaller than n; when the second mode is a single-level cell (SLC) mode in which main data has one effective data bit and at least one dummy data bit, generating forced data by forcing some bit values of the main data to bit values of mode specific data; and outputting one of the main data and the forced data as the reading data according to the detected mode.

When the dummy data bit is stored in a least significant bit (LSB) of the main data in the second mode, the mode specific data may be forced to the LSB of the main data in the generating of forced data.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
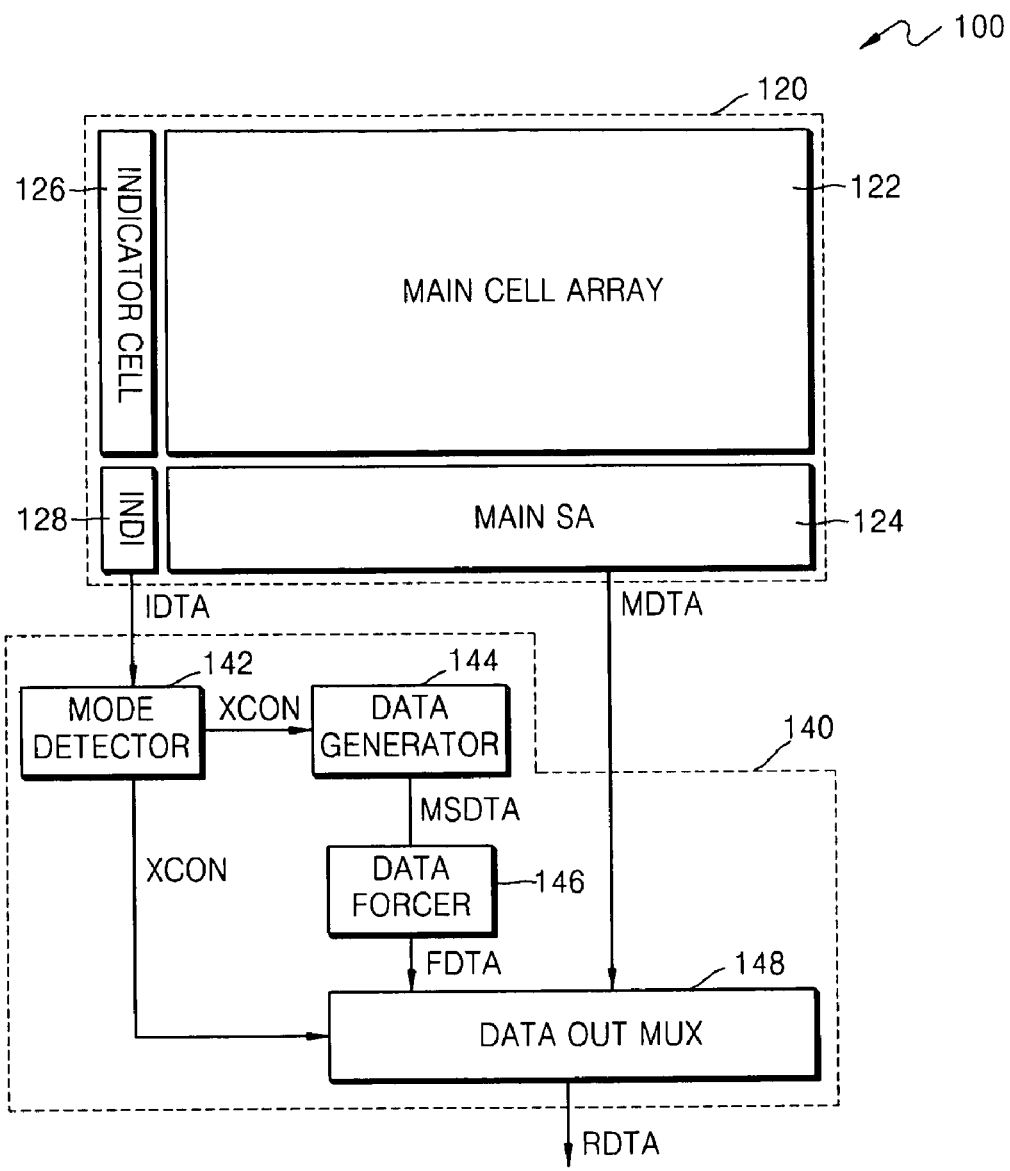
FIG. 1 is a block diagram illustrating a flash memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a flash memory device 100 according to example embodiments.

Referring to FIG. 1, the flash memory device 100 may include a memory cell array 120 and a data output unit 140. The flash memory device 100 according to example embodiments may be a multi-level cell (MLC) NOR flash memory device.

The memory cell array 120 may include a main cell array 122, a main sensing unit 124, indicator cells 126, and an indicator sensing unit 128 regarding the indicator cells 126. The main cell array 122 may store data that is to be written or read. This data will be referred to as main data MDTA hereinafter. Main data MDTA stored in the main cell array 122 may be sensed using the main sensing unit 124.

Figure 2:
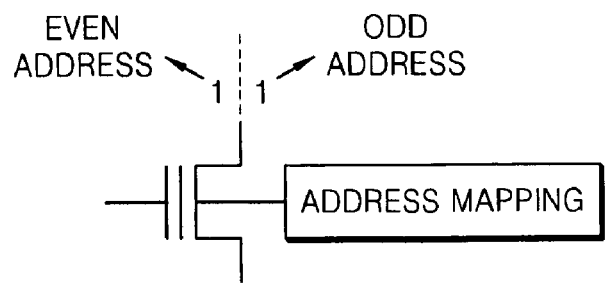
FIG. 2 is a schematic view for explaining a data mapping method of the flash memory device of FIG. 1.

The flash memory device 100 according to example embodiments may read a plurality of bits that are written to one memory cell using an address mapping method. As illustrated in FIG. 2, which is a schematic view for explaining a data mapping method of the flash memory device 100 of FIG. 1, according to example embodiments, when two bits are written to one memory cell, the most significant bit (MSB) of the memory cell may be read using an even address, and the least significant bit (LSB) of the memory cell may be read using an odd address.

Figure 3:
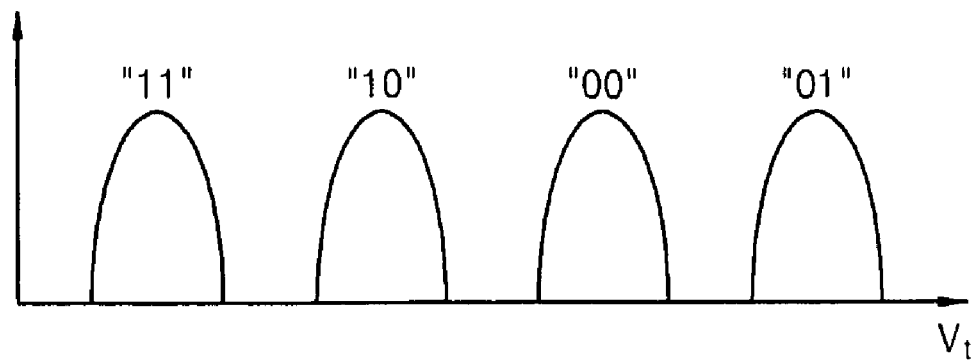
FIG. 3 is a schematic view illustrating cell threshold voltage distributions of a 2-bit multi-level cell (MLC) flash memory device according to example embodiments.
Figure 4:
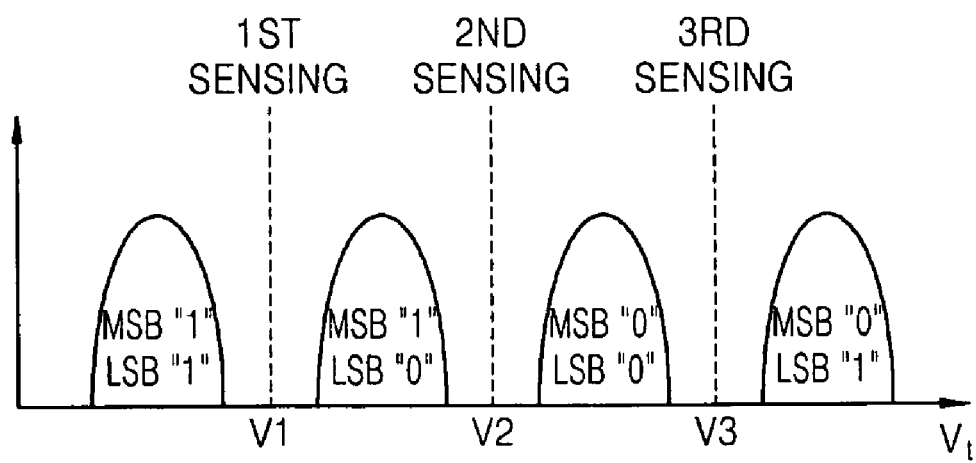
FIG. 4 is a schematic view illustrating a reading operation in the 2-bit MLC flash memory device.

FIG. 3 is a schematic view illustrating cell threshold voltage distributions of a 2 bit MLC flash memory device according to example embodiments, and FIG. 4 is a schematic view illustrating a reading operation in the 2-bit MLC flash memory device.

Referring to FIG. 3, cell threshold voltages of memory cells of the 2-bit MLC flash memory device may vary according to the combination of the MSB and the LSB, and each of the memory cells may indicate one of "11", "10", "00", and "01" binary data values. When the 2 bit MLC flash memory shows 2 bits according to the combination of the MSB and the LSB, in order to read data, both the MSB and the LSB of the memory cells may need to be read as illustrated in FIG. 4, and thus three sensing operations may be required. Hereinafter, a mode that requires three sensing operations or more to read data as two effective bits or more are stored to one memory cell in an MLC flash memory device will be referred to as a multi-level cell (MLC) mode.

In the MLC mode, since intervals between the distributions may be narrow, and the reading margins may be small, the reliability of the MLC flash memory device may be weak. Accordingly, when storing data of important reliability, 1 bit effective data and 1 bit dummy data may be stored in one memory cell. A mode in which 1 bit effective data and 1 bit dummy data are stored in one memory cell in the MLC flash memory device may be referred to as a single-level cell (SLC) mode.

Figure 5:
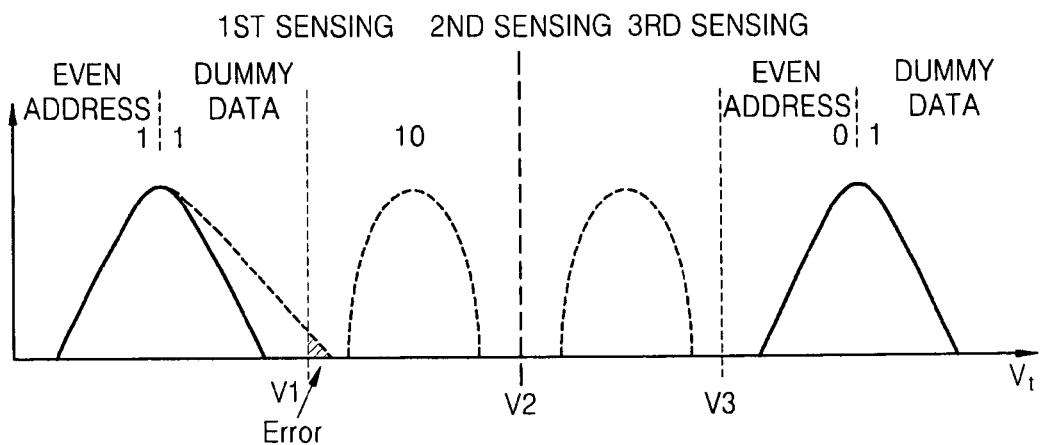
FIG. 5 is a schematic view illustrating cell threshold voltage distributions in a single-level cell (SLC) mode in a multi-level cell (MLC) flash memory device.

FIG. 5 is a schematic view illustrating cell threshold voltage distributions in an SLC mode in an MLC flash memory device.

Referring to FIG. 5, effective data "1" or "0" may be stored in an even address, corresponding to the MSB, and dummy data "1" may be stored in an odd address, corresponding to the LSB. Here, cell threshold voltage distributions denoted with a dotted line may refer to distributions in the MLC mode. Consequently, a distribution interval between two data in an SLC mode may have the characteristics in accordance with the distribution interval in an SLC flash memory device.

In the SLC mode illustrated in FIG. 5, a sensing operation using a predetermined voltage between cell threshold voltage distributions of data "11" and data "01" may be conducted. For example, one of a first sensing operation, a second sensing operation, and a third sensing operation may be conducted. In other words, in the SLC mode, three sensing operations, as in the MLC mode, may not be required.

Referring to FIG. 1 again, the indicator cells 126 may store bit values corresponding to indicate data IDTA of a mode in which the MLC flash memory device operates. Indicator cells 126 may be arranged in a cell array including two cells for each row of main cells in the main memory cell array 122.

Indicate data IDTA may indicate in which among the MLC mode and the SLC mode, a row of a main memory cell corresponding to the indicate data IDTA is stored. Here, the indicate data IDTA may be set to have two bits according to two indicator cells.

Figure 6:
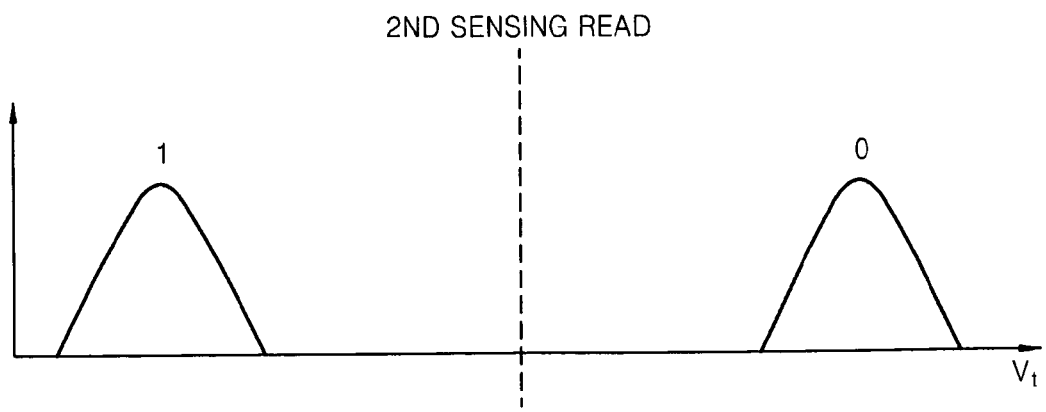
FIG. 6 illustrates distribution of a threshold voltage of an indicator cell.

FIG. 6 illustrates distributions of a threshold voltage of an indicator cell 126.

Referring to FIGS. 1 and 6, the indicator cells 126 may have a value "1" or "0". As described above, when two indicator cells 126 indicate one indicate data IDTA and the indicate data IDTA is "10", the indicate data IDTA may indicate that a row of the main cell array 122 corresponding to the indicate data IDTA is in a MLC mode, and when the indicate data IDTA is "01", the indicate data IDTA may indicate that a row of the main cell array 122 is in a SLC mode. However, example embodiments are not limited thereto, and the indicate data IDTA may also be "11" or "00".

When reading the indicate data IDTA, a predetermined or reference voltage between distributions corresponding to data values of "1" and "0" may be applied to the indicator cells 126 corresponding to the indicate data IDTA. In FIG. 6, a voltage used in a second reading operation in the MLC mode may be applied as an example.

Referring to FIG. 1 again, the data output unit 140 of the flash memory device 100 may include a mode detector 142, a data generator 144, a data forcer 146, and a data output selection unit 148.

The mode detector 142 may receive indicate data IDTA sensed using the indicator sensing unit 128 and determine whether a mode indicated by the indicate data IDTA is an MLC mode or an SLM mode. The mode detector 142 may transmit the determination result as a control signal XCON to the data generator 144 and the data output selection unit 148.

The data generator 144 may output mode specific data MSDTA in response to the control signal XCON. When the control signal XCON indicates an SLC mode, for example, when the control signal XCON is logic high "H", the mode specific data MSDTA may be dummy data "1" that is output by an odd address, as illustrated in FIG. 5.

The data forcer 146 may force the mode specific data MSDTA to main data MDTA to generate forced data FDTA. In detail, the data forcer 146 may generate the forced data FDTA by forcing the mode specific data MSDTA to the LSB of the main data MDTA.

The data output selection unit 148 may output one of the main data MDTA and the forced data FDTA in response to the control signal XCON. In detail, when the control signal XCON indicates an MLC mode, the data output selection unit 148 may output the main data MDTA as reading data RDTA. On the other hand, when the control signal XCON denotes an SLC mode, the forced data FDTA may output the forced data FDTA as reading data RDTA.

Hereinafter, a data reading method 700 of the flash memory device 100 of FIG. 1 will be described.

Figure 7:
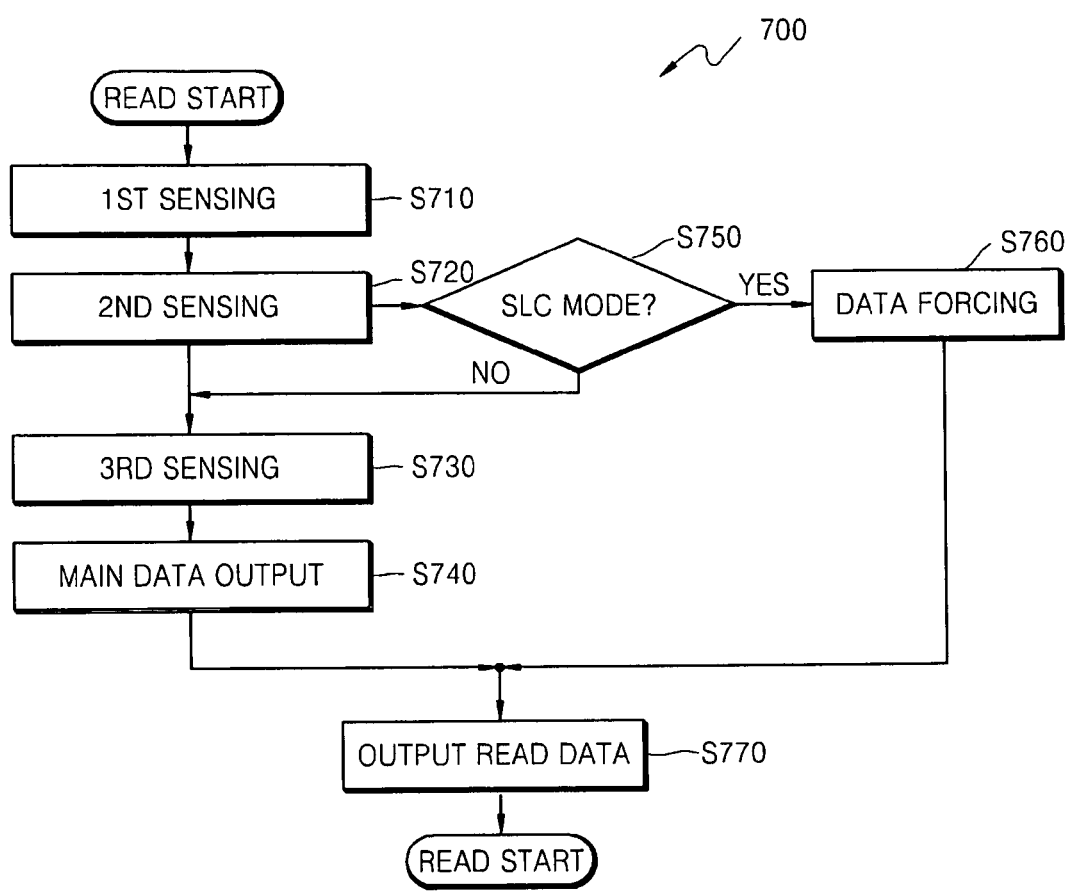
FIG. 7 is a flowchart illustrating a data reading method of the flash memory device of FIG. 1, according to an example embodiments.

FIG. 7 is a flowchart illustrating the data reading method 700 of the flash memory device 100 of FIG. 1, according to example embodiments.

Referring to FIG. 1 and FIGS. 5 through 7, in the data reading method 700 of the flash memory device 100 according to example embodiments, first, an indicator cell and a main cell may be read at the same time. Thus, a first sensing operation may be conducted by the main sensing unit 124 using a first voltage V1, in operation S710. By the first sensing operation, whether a data value of a main memory cell to be read is "11" or not may be sensed.

Next, a second sensing operation is conducted using a second voltage V2, in operation S720. According to the second sensing operation, whether a data value of a main memory cell to be read is "10" or not may be sensed. In the data reading method 700 of the flash memory device 100 according to example embodiments, whether a current mode is an SLC mode or an MLC mode may be detected by a mode detector, in operation S750, at the same time with operation S720.

As described above, a mode may be detected based on indicate data IDTA. The indicate data IDTA may be read during the second sensing operation, as illustrated in FIG. 6.

If it is determined in operation S750 that the current mode is not the SLC mode, i.e., when the current mode is the MLC mode, a third sensing operation is conducted using a third voltage V3, in operation S730. According to the third sensing operation, whether a data value of a main memory cell to be read is "00" is sensed. According to example embodiments, in the MLC mode, the main sensing unit 124 may conduct first through third sensing operations and output one of "11", "10", "00", and "01" as a data value (main data) of the memory cell to be read (main memory cell), in operation S740.

On the other hand, if it is determined in operation S750 that the current mode is the SLC mode, mode specific data MSDTA may be forced to main data MDTA to generate forced data FDTA, in operation S760. As described above, since the mode specific data MSDTA may be dummy data "1" as shown in FIG. 5, the LSB of the main data MDTA which is sensed as one of "11", "10", "00", and "01" may be forced to "1". Accordingly, reading data RDTA may have one of the values "11" and "01" in the SLC mode, as illustrated in FIG. 5.

Accordingly, as illustrated in FIG. 5, even when an error such that a data value "11" is sensed as "10" in the SLC mode occurs, the data value may still be read as "11" by the above-described forcing of dummy data. Thus, with respect to the flash memory device 100 and the data reading method 700 of the same according to example embodiments, even when effective data (e.g., the MSB of the memory cell in the SLC mode) is read exactly but dummy data (e.g., the LSB of the memory cell in the SLC mode) is read incorrectly, a problem such that the effective data is recognized as a read failure may be prevented.

Finally, the data output selection unit 148 may output data corresponding to each mode as reading data RDTA in response to the control signal XCON, in operation S770. As described above, the data output selection unit 148 may output forced data in the SLC mode, and output main data in the MLC mode.

As described above, according to the flash memory device and the data reading method of the same according to example embodiments, data of important reliability may be stored in an SLC mode, and a mode detection operation may be conducted at the same time with a sensing operation in the multi-level cell flash memory device, thereby stably and quickly conducting a reading operation.

While example embodiments been particularly shown and described, example embodiments should be considered in descriptive sense only and not for purposes of limitation.

For example, a 2 bit multi-level cell flash memory is described above; however, example embodiments may also be applied to a 3 bits or more multi-level cell flash memory device.

Figure 8:
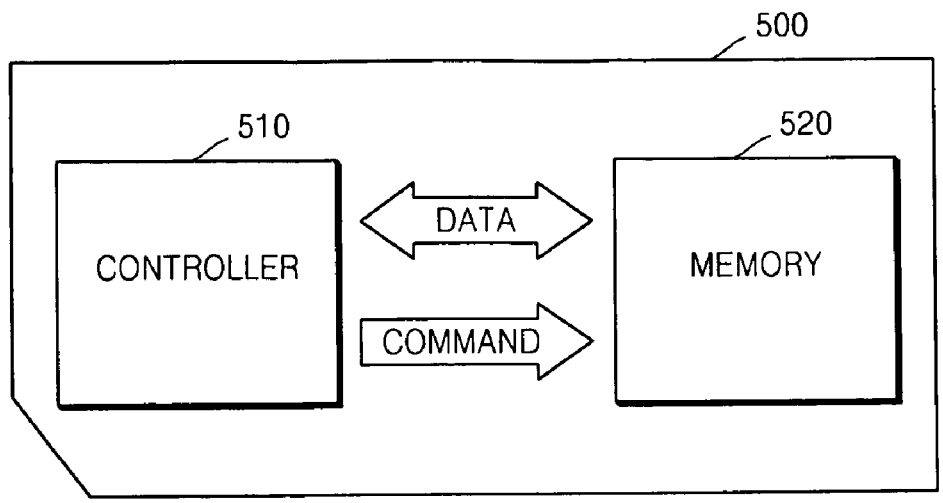
FIG. 8 is a schematic diagram roughly illustrating a memory card 500 according to example embodiments.

FIG. 8 is a schematic diagram illustrating a memory card 500 according to example embodiments. Referring to FIG. 8, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory devices described above in reference to FIGS. 1 through 7.

Such a memory card 500 may be used as a storage medium for various portable electronic devices. For example, the memory card 500 may be a multimedia card (MMC) or a secure digital (SD) card.

Figure 9:
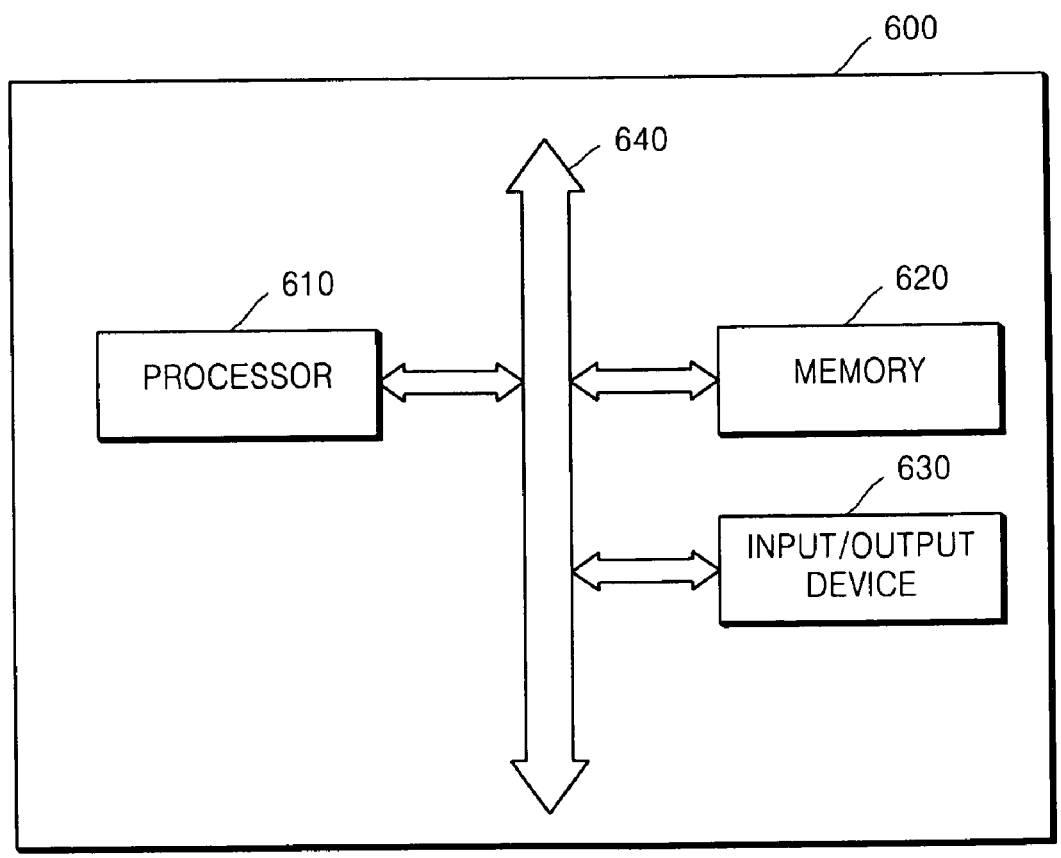
FIG. 9 is a block diagram roughly illustrating an electronic system 600 according to example embodiments.

FIG. 9 is a block diagram roughly illustrating an electronic system 600 according to example embodiments. Referring to FIG. 21, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device, e.g. a personal computer or a network, by using the input/output device 630 and may exchange data with the external device.

The memory 620 may store codes or programs for operations of the processor 610. For example, the memory 620 may include one of the non-volatile memory devices described above in reference to FIGS. 1 through 7.

For example, such an electronic system 600 may embody various electronic control systems requiring the memory 620, and, for example, may be used in mobile phones, MP3 players, navigation devices, solid state disks (SSD), or household appliances.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A multi-level cell flash memory device comprising:
   a memory cell array main memory cells configured to store main data, and indicator cells configured to store indicate data indicating one of a first mode and a second mode in which the main data of the main memory cell, to which the indicate cells correspond, is written; and
   an output unit configured to output one of main data read from the memory cell array and forced data forcing some bit values of the main data to bit values of mode specific data, in response to a control signal corresponding to the indicate data, as reading data.

2. The flash memory device of claim 1, wherein the first mode is a multi-level cell (MLC) mode in which main data that is stored in a main memory cell has a plurality of effective data bits, and
   the second mode is a single-level cell (SLC) mode in which main data stored in a main memory cell has one effective data bit and at least one dummy data bit.

3. The multi-level cell flash memory device of claim 2, wherein in the second mode, the effective data bit is stored in a most significant bit (MSB) of the main data, and the dummy data bit is stored in a least significant bit (LSB) of the main data.

4. The multi-level cell flash memory device of claim 1, wherein the data output unit comprises:
   a mode detector configured to receive the indicate data and generate a control signal corresponding to the indicate data;
   a data generator configured to generate the mode specific data if the control signal is received in a first logic level;
   a data forcer configured to force the mode specific data so that some bits of the main data generate the forced data; and
   a data output selection unit configured to output one of the main data and the forced data in response to the control signal.

5. The multi-level cell flash memory device of claim 4, wherein if the second mode is a mode in which the main data is one effective data bit and at least one dummy data bit, the mode specific data has a data value identical to the dummy data bit.

6. The multi-level cell flash memory device of claim 5, wherein the data forcer is configured so that if the dummy data bit is stored in a least significant bit (LSB) of the main data, the data forcer forces the mode specific data to the LSB of the main data to generate the forced data.

7. The multi-level cell flash memory device of claim 1, further comprising:
   a main sensing unit configured to perform n sensing operations to read the main data, wherein n is a natural number that is equal to or greater than 2; and
   an indicate sensing unit configured to sense the indicate data if the main sensing unit performs an i-th sensing operation, wherein i is a natural number equal to or smaller than n.

8. The flash memory device of claim 7, wherein if the multi-level cell flash memory device is a 2-bit multi-level cell NOR flash memory device and the main sensing unit is configured to perform three sensing operations in order to read the main data,
   the indicate sensing unit is configured to sense the indicate data if the main sensing unit performs a second sensing operation with respect to the main data.

9. The multi-level cell flash memory device of claim 1, wherein the indicator cells include two cells corresponding to each row of the main memory cells in the memory cell array.

10. The multi-level cell flash memory device of claim 9, wherein the indicator data includes two bits of data for each row of the main memory cells in the memory cell array.

11. A method of reading data in a multi-level cell flash memory device including main memory cells storing main data, and indicator cells storing indicate data indicating one of a first mode and a second mode in which the main data of the main memory cell, to which the indicate cells correspond, is written, the method comprising:
   performing n sensing operations with respect to the main data, wherein n is a natural number equal to or greater than 2;
   detecting one of the first mode and the second mode based on the indicate data if performing an i-th sensing operation, wherein i is a natural number equal to or smaller than n;
   if the second mode is a single-level cell (SLC) mode in which the main data has one effective data bit and at least one dummy data bit, generating forced data by forcing some bit values of the main data to bit values of mode specific data; and
   outputting one of the main data and the forced data as reading data according to the detected mode.

12. The method of claim 11, wherein if the dummy data bit is stored in a least significant bit (LSB) of the main data in the second mode, the mode specific data is forced to the LSB of the main data in the generating of forced data.

* * * * *